United States Patent [19]
Göbel et al.

[11] Patent Number: 4,635,264
[45] Date of Patent: Jan. 6, 1987

[54] METHOD AND AN APPARATUS FOR THE SYNCHRONOUS MODE LOCKING OF THE LONGITUDINAL LASER MODES OF A SEMICONDUCTOR DIODE LASER

[75] Inventors: Ernst O. Göbel, Leinfelden-Echterdingen; Jürgen Kuhl, Leonberg; Gustav Veith, Leinfelden-Echterdingen, all of Fed. Rep. of Germany

[73] Assignee: Max-Planck-Gesellschaft zur Foerderung der Wissenschaften e.V., Fed. Rep. of Germany

[21] Appl. No.: 712,257

[22] Filed: Mar. 15, 1985

[30] Foreign Application Priority Data

Mar. 19, 1984 [DE] Fed. Rep. of Germany ....... 3410051

[51] Int. Cl.$^4$ ............................................. H01S 3/098
[52] U.S. Cl. ...................................... 372/18; 372/97; 372/26; 372/9
[58] Field of Search ................. 372/18, 9, 97, 98, 26

[56] References Cited

PUBLICATIONS

Spectral Characteristics of External-Cavity Controlled Semiconductor Lasers by M. W. Fleming and A. Mooradian; 1981 IEEE.
Mode Locking of Strip Buried Heterostructure(Al-Ga)As Lasers Using an External Cavity by J. P. van der Ziel and R. M. Mikulyak; pub. by J. Appl Phys. 51(6), Jun. 1980.
Subpicosecond Pulses from Passively Mode-Locked GaAs Buried Guide Semiconductor Lasers by J. P. van der Ziel, W. T. Tsang, R. A. Logan, R. M. Mikulyak and W. M. Augustyniak; publ. by Appl. Phys. Lett. 39(7), Oct. 1, 1981.
Direct Gain Modulation of a Semiconductor Laser by a GaAs Picosecond Optoelectronic Switch by E. O. Gobel, G. Vieth, a) J. Kuhl, and H.-U. Habermeier; pub. by Appl. Phys. Lett. 42(1), Jan. 1, 1983.
Generation of Subpicosecond Pulses from an Actively Mode Locked GaAs Laser in an External Cavity by J.

P. van der Ziel, R. A. Logan, and R. M. Mikulyak: pub. by Appl. Phys. Lett. 39(11), Dec. 1, 1981.
Picosecond Pulse Generation by Passive Mode Locking of Diode Lasers by E. P. Ippen a) D. J. Eilenberger; pub. by Appl. Phys. Lett. 37(3), Aug. 1, 1980.
Mode Locking of an Organic Dye Laser by W. H. Glenn, M. J. Brienza, and A. J. DeMana; pub. by Appl. Phys. Lett., vol. 12, No. 2, Jan. 15, 1968.
Optically Pumped Mode-Locked InGaAsP Lasers by S. H. Groves and M. C. Plonko, R. S. Putnam, C. B. Roxlo,a) and M. M. Salour b); pub. by Appl. Phys. Lett., vol. 40, No. 8, Apr. 15, 1982.
Picosecond Pulse Generation from a Synchronously Pumped Mode-Locked Semiconductor Laser Diode by John C. AuYeung and Alan R. Johnston; pub. by Appl. Phys. Lett., vol. 40, No. 2, Jan. 15, 1982.

*Primary Examiner*—Léon Scott, Jr.
*Attorney, Agent, or Firm*—Handal & Morofsky

[57] ABSTRACT

A method and an apparatus are described by producing optical radiation pulses with a duration of the order of picoseconds ($10^{-12}$s) and less using external mode locking of the longitudinal laser modes of a semiconductor laser element operating in an external resonator. In the method of the invention the gain modulation, needed for synchronous mode locking, of the active semiconductor laser element is effected by modulation of the electrical pumping current by way of a high-speed optoelectronic switch, that for its part is controlled by a mode locked master laser. The present method combines the advantages of synchronous optical pumping, as used in commercial mode locked dye laser systems, with the simple type of electrical pumping of commercially available semiconductor laser diodes, more especially double heterostructure laser diodes. It respresents a simple and economic alternative to synchronously pumped dye laser systems and considerably extends the spectral range within which radiation pulse may be produced with a duration of the order of picoseconds.

10 Claims, 2 Drawing Figures

METHOD AND AN APPARATUS FOR THE SYNCHRONOUS MODE LOCKING OF THE LONGITUDINAL LASER MODES OF A SEMICONDUCTOR DIODE LASER

BACKGROUND OF THE INVENTION

The invention relates to a method and apparatus for the synchronous mode locking of longitudinal laser modes in a semiconductor diode laser.

Optical light pulses with a duration on the order of picoseconds and fractions thereof may be generated by locking the phases of oscillation modes excited in a laser resonator, i.e. by so-called "mode locking". The minimum pulse width then possible decreases with an increase in the gain band width of the laser-active medium. Consequently laser media with a large gain band width, as for example solutions of organic dyes, F center crystals and semiconductors are more especially suitable for producing pulses of optical radiation of extremely short duration.

A commonly-used form of mode locking is synchronous optical pumping or excitation of a laser by a mode-locked second laser with a lesser band width, see for example the paper of W. H. Glenn et al. in Appl. Phys. Lett. 12, 54, 1968. To cause synchronous mode locking the optical length of the laser producing the pumping pulses has to be equal to the optical length of the laser resonator of the pumped laser or to an integral multiple thereof. Synchronously locked dye laser systems on these lines are commercially available and make it feasible to produce picosecond light pulses in the visible and near infrared range as far as approximately 0.9 $\mu$m.

When compared with dye lasers etc. semiconductor lasers may be seen to be characterized by such features as compactness (typical dimensions being 200 $\mu$m by 200 $\mu$m by 100 $\mu$m) and more especially by the simple method of excitation using an electric current and by the small power requirement (typically being some ten to some hundred mW). Furthermore, semiconductor lasers may cover the full spectral range between about 0.7 $\mu$m and 30 $\mu$m. Semiconductor lasers for the spectral range of 0.7 to 1.6 $\mu$m have reached an extraordinarily advanced stage of technical perfection and at room temperature may be operated continuously for periods far in excess of 100,000 hours.

A number of different methods have been developed for mode locking semiconductor lasers, more especially:

(a) Passive mode locking (E. P. Ippen et al., Appl. Phys. Lett. 37, 267 (1980); J. P. van der Ziel et al., Appl. Phys. Lett. 39, 525 (1981));

(b) Active-passive mode locking (J. P. van der Ziel et al., Appl. Phys. Lett. 39, 867 (1981));

(c) Active mode locking by gain modulation (J. P. van der Ziel et al., Journal Appl. Phys. 52, 4435 (1981); J. C. AuYeung et al., Appl. Phys. Lett 40, 112 (1982));

(d) Synchronous mode locking with optical excitation (R. S. Putman et al., Appl. Phys. Lett. 40, 660 (1982)).

For methods (a), (b) and (d) it is not possible to use commercially available semiconductor diode lasers. Method (a) and (b) necessitate an elaborate preparation of one laser end (involving proton or ion bombardment for producing an internal saturable absorber). Generally method (d) requires cooling of the semiconductor laser diode to low temperatures.

In method (c) mode locking is produced by gain modulation, that for its part results from a modulation of the feed current of the semiconductor diode. The modulation of the current takes place purely electronically using radio frequency or pulse generators. As is the case with the methods (a) and (b) as well, in method (c) simultaneous generation of synchronized mode locked radiation pulse trains is not possible at different emission wavelengths. Not one of the above-noted methods is compatible with commercial synchronously pumped dye laser systems.

Furthermore the publication of E. O. Goebel et al. in Appl. Phys. Lett. 42 (1), Jan. 1, 1983, pages 25 to 27 refers to the use of a high-speed optoelectronic GaAs switch to modulate the gain of a semiconductor laser. The switch is controlled by the radiation pulses of a mode locked dye laser. However, the emission of the semiconductor laser is not mode locked.

SHORT SUMMARY OF THE PRESENT INVENTION

One object of the present invention is to devise a simple method and a simple apparatus for the synchronous mode locking of the longitudinal laser modes of a semiconductor laser, with which the laser radiation pulses may be generated in a wide wavelength range and with a short duration, more especially on the order of picoseconds and less.

In order to effect this and other aims, in the invention a semiconductor laser diode, that is located in an external optical resonator, is supplied with current from an optoelectronic pulse generator, that comprises an optoelectronic switch controlled by the radiation pulses from a master laser.

In the present method the semiconductor laser is controlled by electrical driving pulses with a high time stability, this constituting a basic requirement for optimum mode locking of the semiconductor diode laser synchronously excited by such pulses.

The semiconductor laser is operated in an external optical resonator, one crystal end face of the semiconductor laser diode can be used as the exit mirror if desired. The reflectivity of the second crystal end face, that is placed in the optical path of the laser radiation, is preferably decreased, as for example by producing dielectric layers thereon by vapor coating. This A R coating may be undertaken on regular commercial semiconductor laser diodes at litte expense.

The synchronous mode locking is produced by matching the length of the external resonator with the length of the master laser controlling the optoelectronic switch, this being in keeping with the principle of Glenn disclosed in the above-mentioned publication.

In consequence of the synchronous gain modulation of the semiconductor laser diode being by electrical excitation, it is possible (unlike the case of optical excitation) to use commercially available semiconductor laser diodes. Apart from the A R coating of one cyrstal end face, that has been necessary in all methods of mode locking proposed so far, no further modification of the laser diode is needed, in contrast to former methods for active-passive and passive mode locking in accordance with the publications noted supra.

As compared with synchronously optically pumped mode locked dye laser systems, the novel laser systems disclosed herein are more economical by several orders of magnitude. In principle, the invention makes possible the adaptation of existing synchronously pumped mode locked dye laser systems, since the gas lasers employed for synchronous optical pumping may be used without any modification for driving the optoelectronic switch of the laser system in accordance with the present invention. By such a subsequent adaptation the available spectral range of picosecond laser systems, that supply an uninterrupted pulse train, may be considerably extended.

In addition to the switch element referred to in the paper by Goebel et al., the optoelectronic switch may be of another type, as for example a conventional photodetector with a suitably fast response characteristic and a sufficiently high dynamic range, and for example avalanche photodiodes and PIN photodiodes.

The optoelectronic semiconductor switch may with advantage be fabricated so as to be integrated with the respective semiconductor laser, as for example on a common insulating substrate so that the present method may be practiced with an extremely compact component as may be produced by presently available semiconductor technology.

In what follows a detailed account of the invention will be presented with reference to the drawing, such account revealing further features and beneficial effects of the invention.

SHORT DESCRIPTION OF THE DRAWINGS

DESCRIPTION OF A PREFERRED EMBODIMENT

Figure 1:
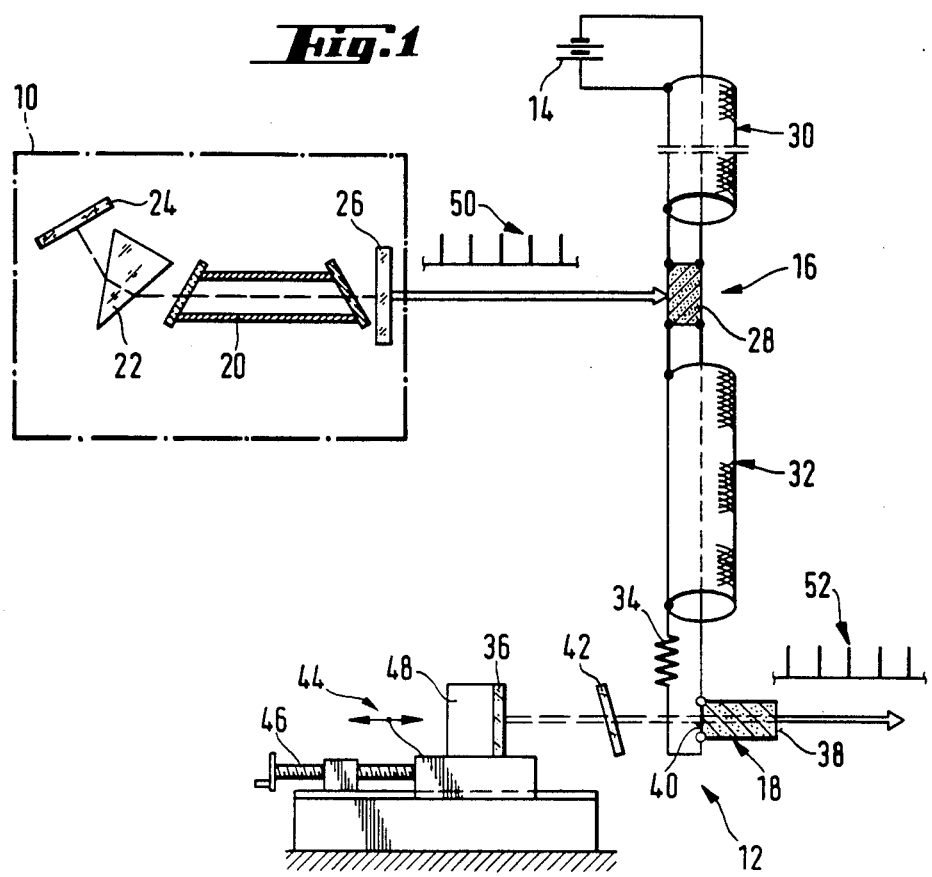
FIG. 1 is a diagrammatic representation of an embodiment of a mode locked semiconductor laser according to the invention.

The apparatus shown in FIG. 1 comprises, as its main parts, a mode locked master laser 10, a semiconductor laser 1,2, an excitation or pump power supply 14 for the semiconductor laser and a high-speed optoelectronic switch 16, that is connected between the pump power supply 14 and a semiconductor laser diode 18 of the semiconductor laser 12.

As shown, the master laser 10 is preferably a mode locked gas ion laser, such as an Ar+ or a Kr+ laser for example, that may comprise a laser gas vessel 20 and a mode lock prism 22, that is located in an optical resonator, that is delimited by a 100% reflecting mirror 24 and a partially transmissive mirror 26. The laser 10 may be of conventional construction so that the pump energy supply is omitted for the sake of simplicity.

In lieu of a gas laser it is possible to utilize another type of laser as a master laser 10, as for example a mode locked solid state laser, such as an Nd:YAG or ruby laser, or a mode locked dye laser.

The semiconductor laser diode 18 may be a commercially available BH GaAs/GaAlAs semiconductor diode (BH=buried heterostructure).

The optoelectronic switch 16 comprises a photoconductor element 28, that consists of chromium doped gallium arsenide. In place of such a GaAs:Cr photoconductor it is also possible to employ avalanche or PIN photodiodes with a sufficiently fast response characteristic.

As shown, the optoelectronic switch 16 is connected between the inner conductor and the outer conductor of two radio frequency or transmission lines, such as coaxial cables 30 and 32, respectively, of which the one cable 30 connects the photoconductor 28 with the excitation energy source 14 and the other cable 32 connects the photoconductor 28 through a series-connected matching resistor 34 with the laser diode 18. The resistor 34 matches the typically relatively low resistance of the laser diode 18 to the characteristic impedance of the radio frequency line 32, but may be omitted. The semiconductor laser diode would then essentially form a short circuit of the radio frequency line.

The semiconductor laser 12 comprises an external optical resonator, that at one end is defined by a mirror 36 whose reflectivity is as high as possible and at the other end by a crystal end face 38 of the monocrystalline semiconductor member of the laser diode 18, said end face 38 reflecting only partially. The other crystal end face, that is opposite to the crystal end face 38 functioning as an exit mirror, is provided with an antireflection (AR) layer 40. The optical cavity or resonator of the semiconductor laser 12 includes frequency selective means or optical band filter means 42, as a thin film interference filter and/or a Fabry-Perot etalon. The optical resonator of the semiconductor laser may be defined alternatively by a pair of external mirrors with different reflectivities, it then being preferred for the two crystal end faces of the semiconductor member of the laser diode to have an additonal A R coating for producing a suitable modification of its reflection properties. In the case of the use of a resonator with only one external mirror the crystal end face, functioning as a second resonator mirror, may be modified and more specially enhanced in its reflectivity by an additional dielectric coating in order to modify the power and duration of the output pulses.

The length of the resonator of the semiconductor laser 12 is able to be adjusted for matching with respect to the optical length of the resonator of the master laser 10 by displacing the reflector 36. The reflector 36 is for this purpose supported by an adjustment device 44, that comprises a coarse adjustment device 46 and a fine adjustment device 48. The coarse adjustment device 46 may, as illustrated, comprise a carriage that is adjusted by a lead screw, the fine adjustment device 48 being mounted on the carriage. The fine adjustment device 48 may be a conventional piezoelectric transducer, on which the reflector 36 is mounted.

OPERATION

For operation the first step is to match the length of the resonator 36–38 of the semiconductor laser 12 to the length of the resonator 22–24 of the master laser 10. The optical length of the resonator of the master laser 10 may be equal to, or an integral multiple of, the length of the resonator of the semiconductor laser. The master laser is operated, as known, with mode locking and supplies an optical pulse train 50 of short optical pulses, whose duration may for example be of the order of 100 picoseconds and less.

Such pulses control the optoelectronic switch 16, that in response to each pulse of the pulse train 50 shortcircuits the end, remote from the laser diode 18, of the radio frequency line 32. Thus, short current pulses, that are very accurately timed, and are produced by the discharge of the capacitance of the radio frequency line 30 are superimposed on the relatively low constant current normally flowing through the semiconductor laser diode. These current pulses modulate the gain of the laser diode, that consequently, cooperating with the matched optical resonator 36–38 supplies very short, mode locked optical output pulses 52, the duration whereof is of the order picoseconds and less.

The wavelength of the output radiation of the semiconductor laser 12 may be adjusted in a conventional manner using the band filter 42.

Figure 2:
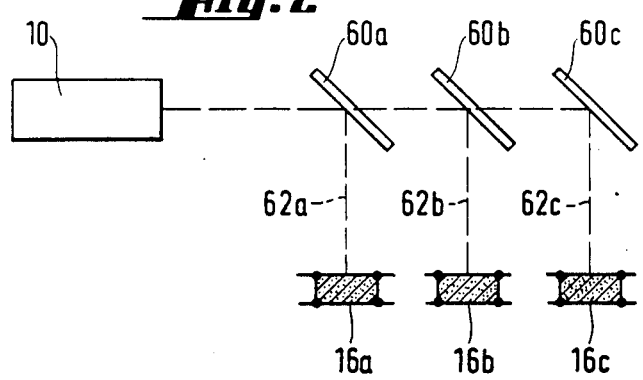
FIG. 2 is a diagrammatic view of part of multi-laser system operating in accordance with the present invention.

Furthermore the present invention provides a simple way of mode locking two or more semiconductor lasers in external resonators synchronously in parallel. For this purpose the pulse train of the master laser 10 may be split up by beam splitters 60a, 60b, 60c etc. into two or more component beams 62a, 62b 62c as is illustrated in FIG. 2 for the case of three beam splitters and three component beams. Each of the component beams controls a corresponding optoelectronic switch 16a, 16b or 16c, respectively, that for its part then controls a semiconductor laser, not shown in FIG. 2, corresponding to the semiconductor laser 12 in FIG. 1. Such parallel operation of a number of semiconductor lasers is more especially made possible by the fact that the power, that is needed for controlling the optoelectronic switches and thus the semiconductor lasers, is extremely low.

The master laser may furthermore be a pulsed mode locked laser, which then supplies corresponding bursts. The synchronously mode locked semiconductor laser or lasers then supply corresponding bursts. This latter feature is more particularly significant when using passively mode locked Nd:YAG or ruby lasers and flash lamp pumped dye lasers.

It will be appreciated that the invention provides a method for producing optical radiation pulses with a duration in the order of picoseconds ($10^{-12}s$) and less by synchronous mode locking of the longitudinal laser modes of a semiconductor laser element operating in an external resonator. In the method of the invention the gain modulation, necessary for synchronous mode locking, of the active semiconductor laser element is effected by modulation of the electric pumping current, the modulation of the pumping current in turn being effected by a high-speed optoelectronic switch, that for its part is controlled by a mode locked laser. The present method combines the advantages of synchronous optical pumping, as employed in commercial mode locked dye laser systems, with the simple type of electrical pumping of commercially available semiconductor laser diodes, more especially double heterostructure laser diodes. It represents a simple and economic alternative to synchronously pumped dye laser systems and substantially increases the spectral range, in which radiation pulses may be produced with a duration of the order of picoseconds.

In a practical embodiment of the invention, the master laser 10 was a commercially available actively mode locked Ar+ ion laser of the company Spectra Physics, Model 171. The photoconducting element 28 comprised a member measuring 1 mm by 5 mm by 0.3 mm of commercially available, semi-insulating, Cr-doped gallium arsenide substrate material with a typical resistivity of $10^8$ ohm.cm, as available from Wacker Chemitronic, Burghausen, Western Germany. The parts of the rf. lines in contact with the body of the photoconductor 38 are formed by a stripline. The width of the stripline was 250 μm, the thickness of the photoconductor member being matched to this.

The gap between the ends of the stripline on the side facing the master laser 10 of the photoconductor 28 was 25 μm wide. The stripline had a characteristic impedance of 50 ohms.

The length of the rf. line 30 is not critical. In practice a 1 meter piece of commercial coaxial cable with a characteristic impedance of 50 ohms was used. The rf. line 32 has to be as short as possible. In the embodiment it was a 5 centimeter length of 50 ohm coaxial cable. The voltage of the power supply 14 typically amounts to 25 volts maximum. The resistance of the matching resistor 34 depends on the resistance of the optoelectronic switch in the illuminated condition and may be between 1 and 50 ohms. In the present case a matching resistance 34 of 50 ohms was employed.

The laser diode 38 was a diode of the type HL-3400 of The Hitachi Company, Japan. The AR coating of the end face 40 was produced in a known manner (see for example G. Eisenstein, L. W. Stulz, Applied Optics 23, 161 (1984)) in the form of a dielectric quarter wavelength coating. The wavelength of the radiation from the master laser amounted to 514.5 nm. The length of the resonator of the master laser and of the external resonator of the laser diode amounted each to approximately 180 cm. The laser light emitted from the exit face 40 was collimated with a microscope objective with a focal length of 0.25 cm. For checking the bandwidth and tuning the laser diode output radiation use was made of a narrow-band interference filter (bandwidth 5 nm), in combination with an additional 80 μm thick etalon (R=30%).

The laser diode supplied radiation pulses with a wavelength of 841 nm and a duration of 30 ps FWHM with a repetition rate of 80.32 MHz and a mean output power of typically 250 microwatts.

We claim:

1. A method for the synchronous mode locking of the longitudinal laser mode in a semiconductor diode laser, comprising the steps of:
    (a) operating a master laser to generate a series of pulses;
    (b) controlling an optoelectronic pulse generator with said master laser;
    (c) synchronously exciting a semiconductor laser diode with said optoelectronic pulse generator; and
    (d) operating said semiconductor laser diode in an external resonator configuration to generate a laser output.

2. Apparatus for synchronous mode locking of the longitudinal laser modes of a semiconductor diode laser, comprising:
    (a) a master laser generating a train of short radiation pulses;
    (b) an optoelectronic switch with a short response time coupled to receive the output of said master laser and controlled by said master laser;
    (c) an electrical pumping power supply coupled to said optoelectronic switch driving said optoelectronic switch;
    (d) a semiconductor laser diode coupled to the output of said optoelectronic switch;
    (e) an external resonator in which said laser diode is located, said master laser comprising an optical resonator whose length is equal to the optical length of the external resonator of the semiconductor laser multiplied by an integral number including unit.

3. The apparatus as claimed in claim 2 wherein said external resonator of said semiconductor laser includes a frequency selective means.

4. The apparatus as claimed in claim 3 wherein said frequency selective means comprises at least one element selected from the group consisting of an interference filter and an etalon.

5. The apparatus as claimed in claim 2 wherein said optoelectronic switch comprises a photoresistor and a radio frequency line connecting said photoresistor with said semiconductor laser diode.

6. The apparatus as claimed in claim 5 wherein said semiconductor diode is connected in series with said radio frequency line.

7. The apparatus as claimed in claim 6 further including a matching resistor connected in series with said diode and said radio frequency line.

8. The apparatus as claimed in claim 2 wherein said external resonator of said semiconductor laser include a frequency selective means, said optoelectronic switch comprising a photoresistor and a radio frequency line connecting said photoresistor with said semiconductor laser diode.

9. The apparatus as claimed in claim 2 comprising at least two such semiconductor lasers, one optoelectronic switch for each such laser, each of said semiconductor lasers being controlled by its respective optoelectronic switch and beam splitting means for controlling each of said optoelectronic switches by a single master laser.

10. The apparatus as claimed in claim 2 wherein said master laser in a pulse mode locked laser providing source bursts of optical radiation pulses.

* * * * *